(12) United States Patent
Wang et al.

(10) Patent No.: US 10,147,714 B2
(45) Date of Patent: Dec. 4, 2018

(54) METHOD, APPARATUS, AND SYSTEM FOR TWO-DIMENSIONAL POWER RAIL TO ENABLE SCALING OF A STANDARD CELL

(71) Applicant: GLOBALFOUNDRIES INC., Grand Cayman (KY)

(72) Inventors: Yan Wang, San Jose, CA (US); Jia Zeng, Sunnyvale, CA (US); Chenchen Wang, Santa Clara, CA (US); Wenhui Wang, Clifton Park, NY (US); Lei Yuan, Cupertino, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 2 days.

(21) Appl. No.: 15/289,401

(22) Filed: Oct. 10, 2016

(65) Prior Publication Data

US 2018/0102354 A1   Apr. 12, 2018

(51) Int. Cl.
 *H01L 27/02* (2006.01)
 *H01L 21/768* (2006.01)
 *G06F 17/50* (2006.01)

(52) U.S. Cl.
 CPC ...... *H01L 27/0207* (2013.01); *G06F 17/5077* (2013.01); *H01L 21/76838* (2013.01)

(58) Field of Classification Search
 CPC .......... H01L 27/0207; H01L 21/76838; G06F 17/5077
 USPC .......................................... 716/118, 119, 120
 See application file for complete search history.

(56) References Cited

U.S. PATENT DOCUMENTS

| | | | | |
|---|---|---|---|---|
| 5,987,086 | A * | 11/1999 | Raman et al. ...... | G06F 17/5077 716/120 |
| 2009/0032898 | A1 * | 2/2009 | Becker et al. ...... | G06F 17/5068 257/499 |
| 2012/0144360 | A1 * | 6/2012 | Smayling ............ | G06F 17/5036 716/119 |
| 2013/0126978 | A1 * | 5/2013 | Becker .................. | H01L 27/092 257/369 |

\* cited by examiner

*Primary Examiner* — Sun Lin
(74) *Attorney, Agent, or Firm* — Williams Morgan, P.C.

(57) ABSTRACT

At least one method, apparatus and system disclosed involves providing a functional cell for a circuit layout for an integrated circuit device. A determination as to a first location for a two-dimensional portion of a first power rail in a functional cell is made. A first portion of the first power rail is formed in a first direction. A second portion of the first power rail is formed in a second direction in the first location for the two-dimensional portion.

20 Claims, 11 Drawing Sheets

METHOD, APPARATUS, AND SYSTEM FOR TWO-DIMENSIONAL POWER RAIL TO ENABLE SCALING OF A STANDARD CELL

BACKGROUND OF THE INVENTION

Field of the Invention

Generally, the present disclosure relates to the manufacture of sophisticated semiconductor devices, and, more specifically, to various methods and structures for using scaling standard cells using two-dimensional power rails for manufacturing semiconductor devices.

Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

In this manner, integrated circuit chips may be fabricated. In some cases, integrated circuit or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

When designing a layout of various devices with an integrated circuits (e.g., CMOS logic architecture), designers often select pre-designed functional cells or standard cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or lower integrated circuit designs.

Figure 1:
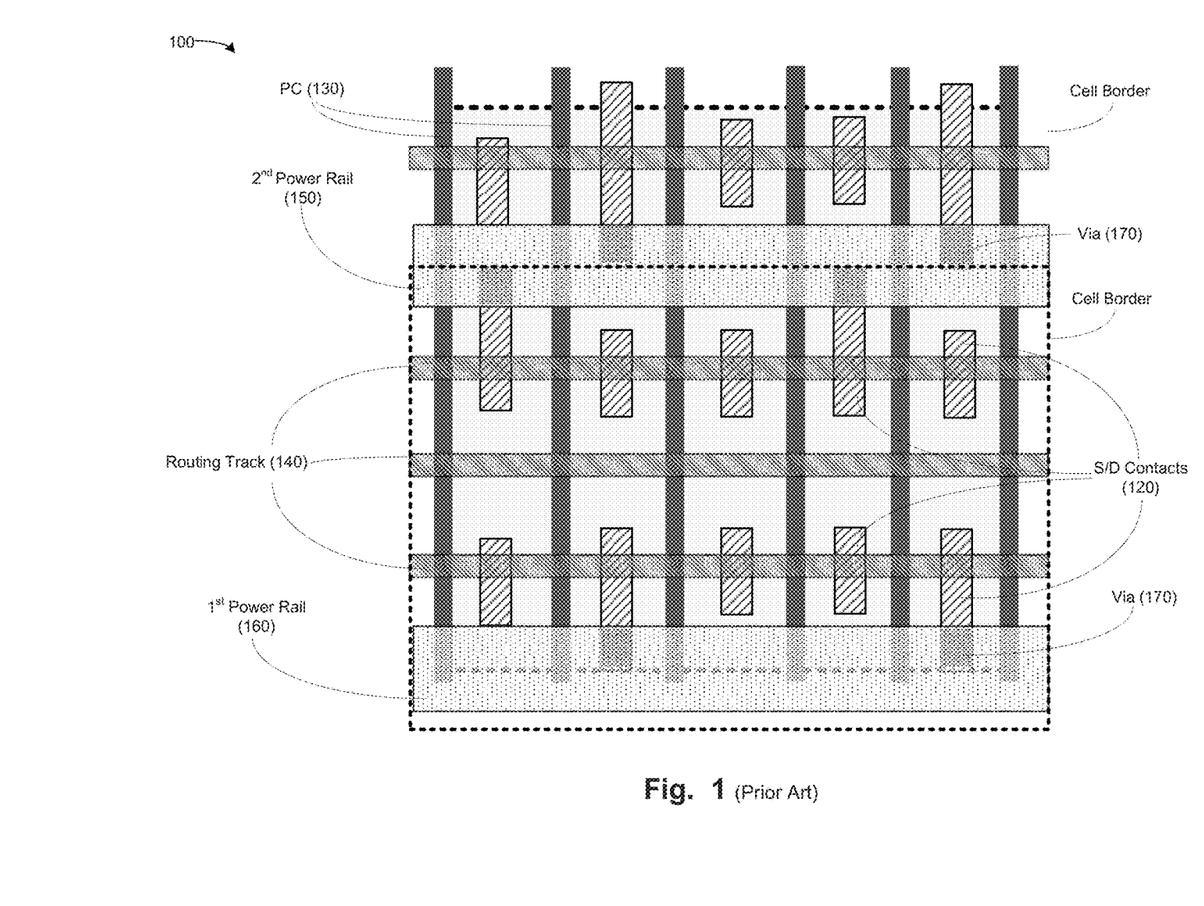
FIG. 1 illustrates a stylized depiction of a typical standard cell for a 10 nm node design.

FIG. 1 illustrates a stylized depiction of a typical standard cell. A cell 100 comprises a plurality of routing tracks 140 (e.g., M2 routing tracks) on which metal routing features may be formed. Standard cells, such as the cell 100 of FIG. 1 generally comprise two wide metal power rails. The cell 100 includes a $1^{st}$ power rail 150, which is a VDD power rail, and a $2^{nd}$ power rail 160, which is a VSS power rail. The width of the power rails 150, 160 are designed to provide sufficient drive current to circuits that are built using standard cells.

The standard cell 100 includes a plurality of source/drain (S/D) contacts 120, e.g., CB, CA, and trench silicide (TS) features. The cell 100 also comprises a plurality of PC features (gates) 130. Further, a plurality of vias 170 may be used to connect and/or route one or more metal features, S/D features 120, and/or power rails 150, 160. A plurality of routing tacks 140 in the cell 100 may be used to route connections to one or more metal features, S/D features 120, and/or power rails 150, 160.

There is a constant desire in the industry to scale down technology so the smaller electronic devices may be produced. As such, there is a strong push to reduce the size of state-of-the-art standard cells, while maintain their functionality and drive strength. However, it is increasingly difficult to reduce the contacted poly pitch (CPP) of standard cells. As a result, designers have contemplated simply reducing the height of the standard cells, thereby reducing the pitch of the routing tracks 140 and the width of the power rails.

Figure 2:
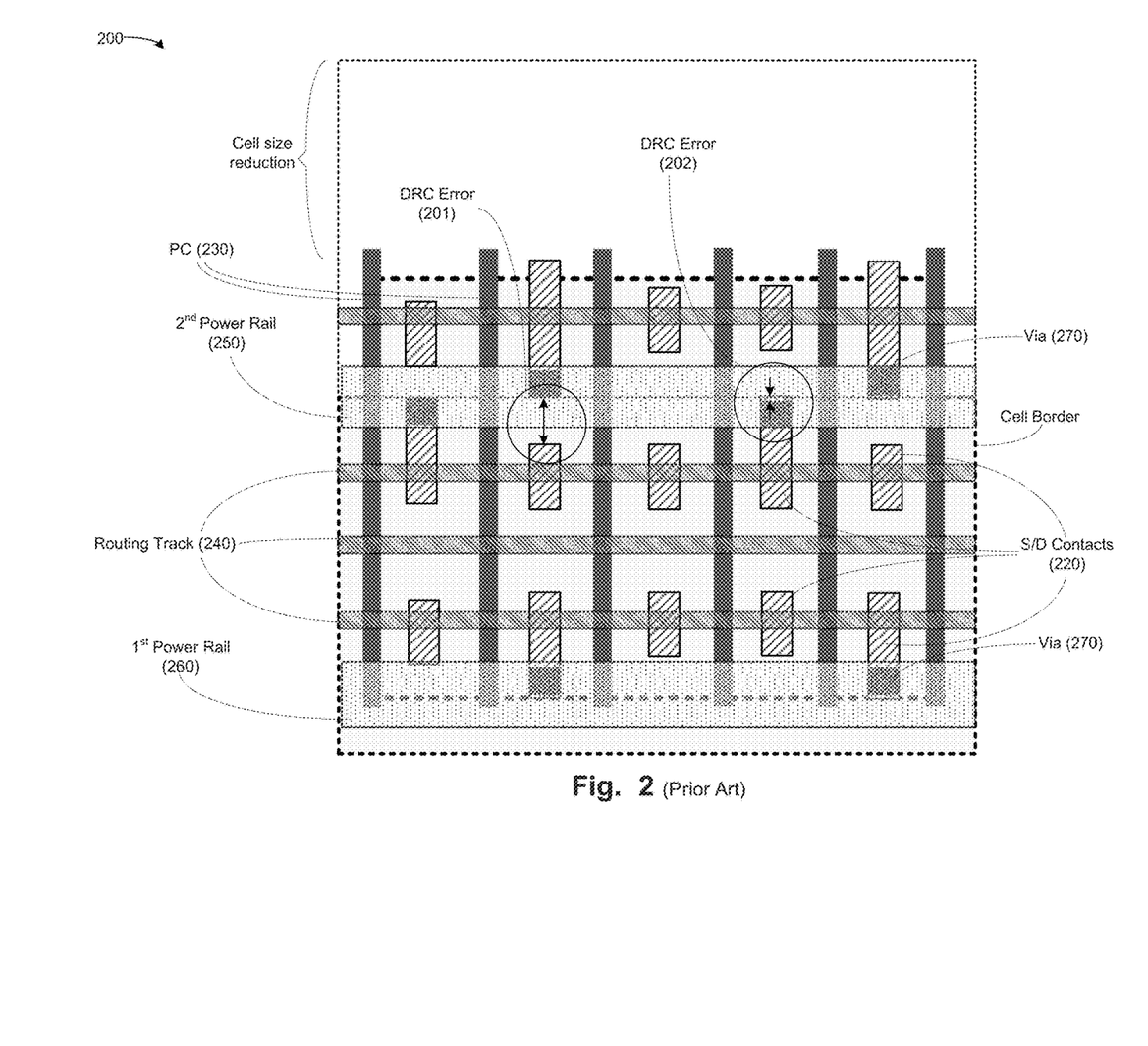
FIG. 2 illustrates a stylized depiction of a state-of-the-art standard cell with reduced height and power rail widths.

FIG. 2 illustrates a stylized depiction of a state-of-the-art standard cell with reduced height and power rail widths. FIG. 2 represents an attempt to reduce the size of the cell 100 of FIG. 1 by decreasing the pitch of the tracks 140 of the functional cell as well as reducing the power rails.

A cell 200 comprises a plurality of routing tracks 240 (e.g., M2 routing tracks) on which metal routing features may be formed. The standard cell 200 comprises two wide metal power rails. The cell 200 includes a $1^{st}$ power rail 250, which is a VDD power rail, and a $2^{nd}$ power rail 260, which is a VSS power rail. In order to accommodate the small track pitch of the cell 200 (as compared to the cell 100 of FIG. 1), designers have implemented power rails 250, 260 that are significantly less wide than the power rails 150, 160 of FIG. 1.

Further, the standard cell 200 includes a plurality of source/drain (S/D) contacts 220, e.g., CB, CA, and trench silicide (TS) features. The cell 200 also comprises a plurality of PC (gate) features (Mx) 230. Further, a plurality of vias 270 may be used to connect and/or route one or more gate features 230, S/D features 220, and/or power rails 250, 260. A plurality of routing tacks 240 in the cell 200 may be used to route connections to one or more gate features 230, S/D features 220, and/or power rails 250, 260.

In order to accommodate the smaller track pitch of the cell 200, the power rails are less wide and the S/D features 220 are shorter (as compared to the features of cell 100 of FIG. 1). Further, a smaller number of fins of a finFET device are implemented in the smaller cell 200.

The smaller width of the power rails 250, 260 exhibit various problems, such as lower amount of drive current to circuits that are built using standard cells. Further, a smaller number of fins generate circuits of smaller drive current. Moreover, vias 270 being positioned on the smaller-width the power rails 250, 260 and/or the smaller S/D can cause via enclosure design errors (as indicated by circle 202). Further, S/D contact tip-to-tip rules may be violated using the smaller track pitch and power rails 250, 260 (as indicated by the circle 201). Therefore, these problems cause various design rule violations and cause the attempts in reducing the size of the functional cells to become impractical and fraught with errors.

Figure 3:
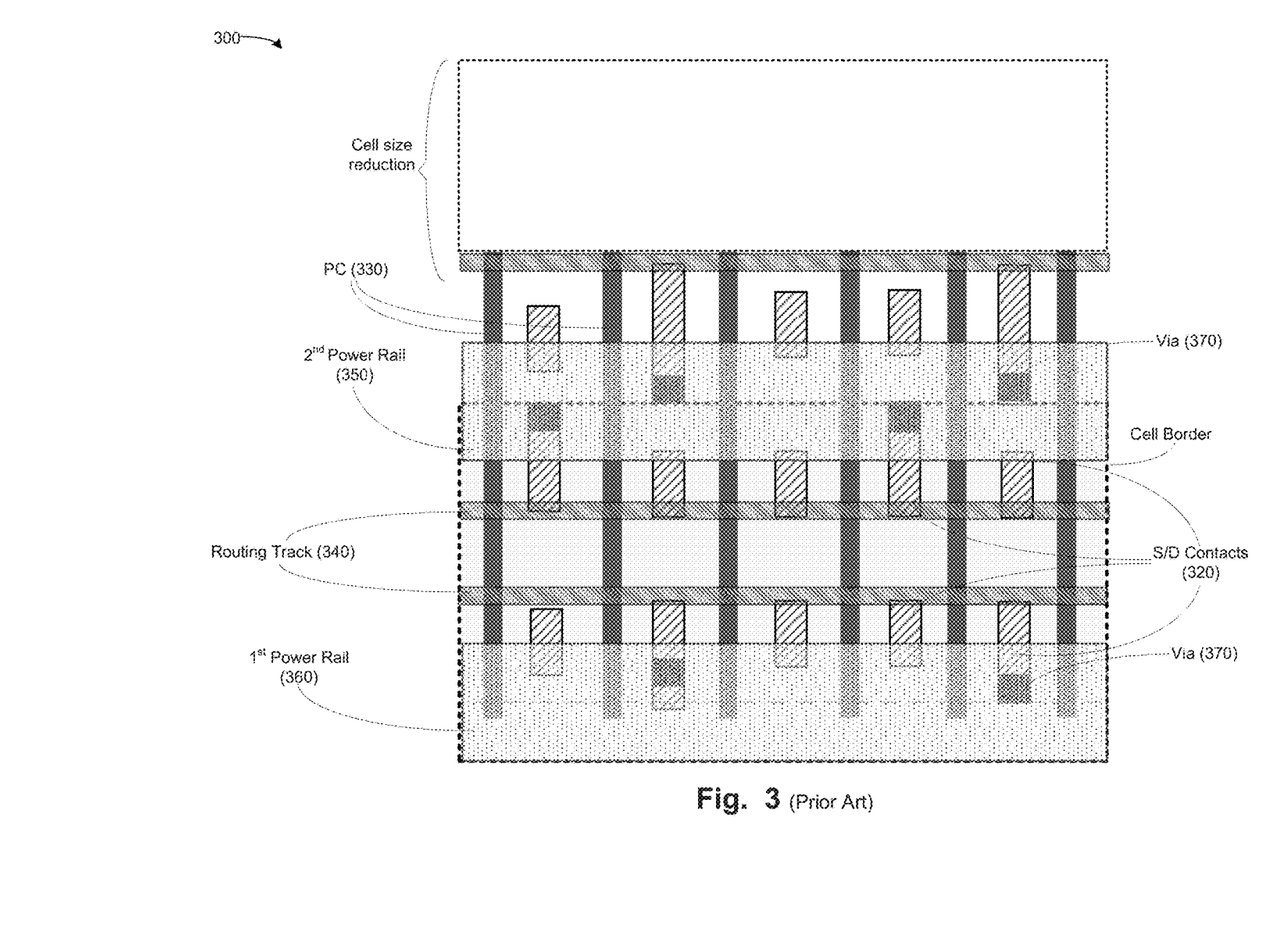
FIG. 3 illustrates a stylized depiction of a reduced-size state-of-the-art standard cell having a reduced number of tracks.

Designers have attempted to address the problems of power rails of smaller widths by simply maintaining the wider dimensions of the power rails of FIG. 1, while reducing the number of tracks that are implemented in the smaller standard cell. FIG. 3 illustrates a stylized depiction of a state-of-the-art reduced-size standard cell having a reduced number of tracks.

A cell 300 comprises a plurality of routing tracks 340 (e.g., M2 routing tracks) on which metal routing features may be formed. As compared to the number of routing track of the cell 200 of FIG. 2, a smaller number of routing tracks 340 are present in the cell 300. The lower number of tracks 340 are implemented in order to maintain the width of the power rails, relative to the width of the power rails of cell 200 of FIG. 2. Therefore, the standard cell 300 comprises two wide metal power rails that are comparable to the wide power rails of the cell 100 of FIG. 1. The cell 300 includes a 1st power rail 350, which is a VDD power rail, and a 2nd power rail 360, which is a VSS power rail. Therefore, as compared to the cell 100, the cell 200 of FIG. 2 is made smaller by using smaller track pitch and narrower power rails. In contrast, as compared to the cell 100, the cell 300 of FIG. 3 is made smaller by implementing a lesser number of routing track while maintaining the width of the power rails.

Further, the standard cell 300 includes a plurality of source/drain (S/D) contacts 320, e.g., CB, CA, and trench silicide (TS) features. The cell 300 also comprises a plurality of PC (gate) 330. Further, a plurality of vias 370 may be used to connect and/or route one or more gate features 330, S/D features 320, and/or power rails 350, 360.

One of the problems associated with the design of the cell 300 is that the lower number of routing tacks 340 in the cell 300 makes it difficult to route connections to one or more gate features 330, S/D features 320, and/or power rails 350, 360. This forces designers to implement a lower number of fins in finFET devices. The usage of lower number of fins causes the drive current of the device formed from the features of the cell 300 to be lower. Therefore, using the solution implemented in FIG. 3 causes the drive strength of the cell 300 to be lower. This lower the performance of integrated circuits formed using the cell 300. Therefore, as described above, there are various inefficiencies, routing difficulties, design rule errors, and other problems associated with the state-of-art.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for a functional cell for a circuit layout for an integrated circuit device. A determination as to a first location for a two-dimensional portion of a first power rail in a functional cell is made. A first portion of the first power rail is formed in a first direction. A second portion of the first power rail is formed in a second direction in the first location for the two-dimensional portion.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing a standard cell scaling process for reducing the size of a standard cell. Embodiments herein call for reducing the height of a functional or standard cell, while maintaining the standard number of tracks. In some embodiment, a functional cell may be reduced in size while maintaining the number of routing tracks, the width of metal power rail features in predetermined locations, the number of metal features, and the number of source/drain contacts of a transistor (e.g., CA, CB, and/or TS features) for maintaining drive current parameters.

Embodiments herein call performing a standard cell scaling process for reducing the size of a standard cell while maintaining the width of standard power rail metal features in predetermined locations. In embodiments herein, this may be accomplished by providing two dimensional power rail features. In a standard cell, in which the track pitch is made smaller for reducing the size of the cell, two-dimensional power rails that are proportionally smaller to match the smaller functional cell may be used, however, a portion of the power rails may be wider in certain regions to accommodate design rules. For example, power rail features may be formed to comprise one or more extensions at predetermined locations, leading to the usage of two-dimensional power rails. In some embodiments, the first dimension of the two-dimensional power rails may be in a first direction, e.g., a horizontal direction, and the second dimension may be in a second direction, e.g., a vertical direction.

The extensions of the power rails may be positioned such to accommodate vias and provide for sufficient tip-to-tip spacing. In this manner, smaller functional/standard cells having tighter metal pitch may be developed, while providing for a desirable number of routing tracks and adherence to design rules, such as via enclosure rules and tip-to-tip rules.

Therefore, utilizing embodiments herein, the same number of tracks, other metal features, and connection features may be maintained while reducing the size/height of functional/standard cells. As a non-limiting example, semiconductor devices of 10 nm or smaller dimensions may be developed into smaller functional cells, while maintain the number of tracks.

Figure 4:
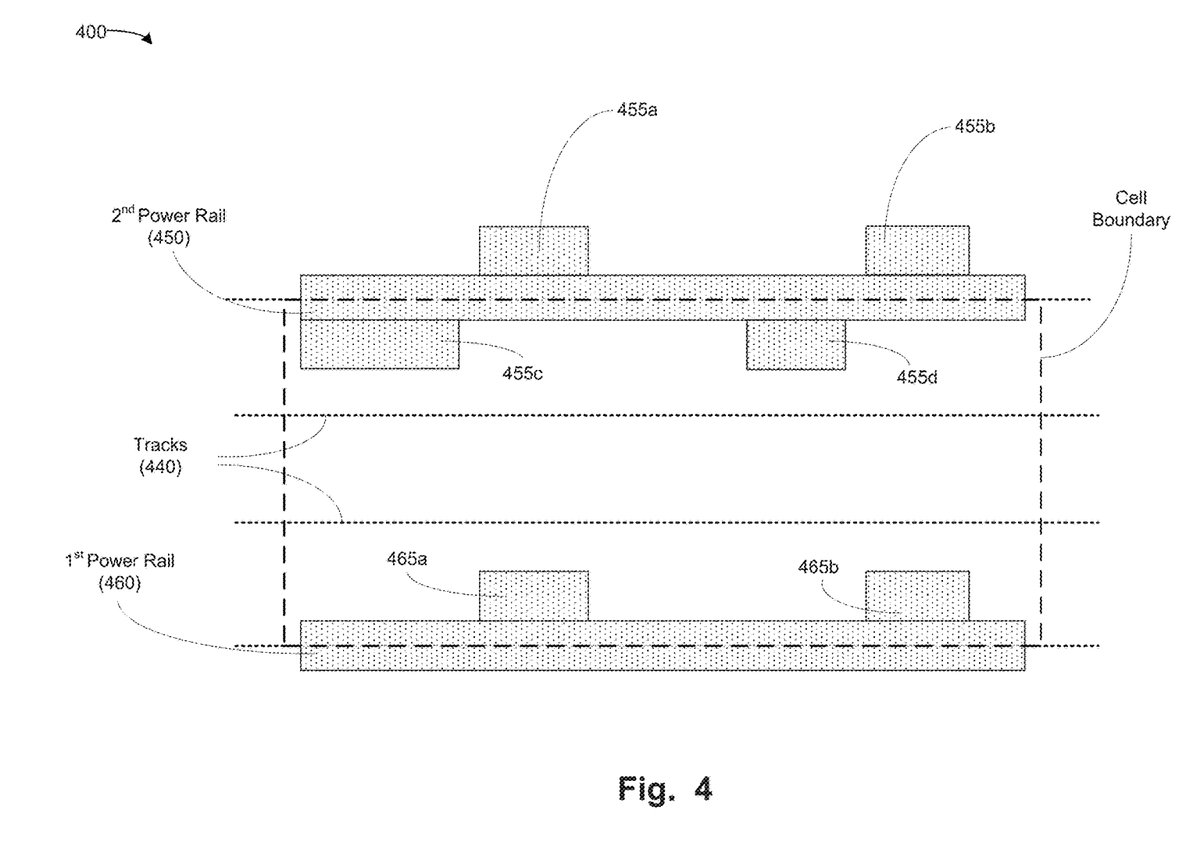
FIG. 4 illustrates a stylized depiction of a $1^{st}$ power rail and a second power rail of a functional cell, in accordance with embodiments herein.

Turning now to FIG. 4, a stylized depiction of a $1^{st}$ power rail and a second power rail of a functional cell, in accordance with embodiments herein, is illustrated. FIG. 4 shows two power rails that may be implemented into a standard cell design. A $1^{st}$ power rail 460 may be tied to VSS, wherein a $2^{nd}$ power rail 450 may be tied to VDD. The power rails 450, 460 each comprises a main body and a plurality of extensions at predetermined, strategic locations of the main body.

The power rails 450, 460 are generally positioned on a series of tracks 440 that may implemented into a standard/ functional cell. The power rails 450, 460 are centered about a cell boundary 490 of the cell 400. In one embodiment, the $2^{nd}$ power rail 450 may be shared with another cell that may be placed adjacent to the cell 400. Therefore, the top portion of the cell boundary 490 (on which the $2^{nd}$ power rail 450 is positioned) may be shared by another cell that is placed adjacent the cell 400.

In one embodiment, the $1^{st}$ power rail 460 comprises a $1^{st}$ extension 465a and a $2^{nd}$ extension 465b. The $1^{st}$ and $2^{nd}$ extensions 465a, 465b are placed such that design rules e.g., (via enclosure rules and tip-to-tip rules) are satisfied. For example, the $1^{st}$ extension 465a may be positioned to accommodate a via and conform to via enclosure rules. The $2^{nd}$ extension 465b may be positioned to accommodate tip-to-tip requirements with respect to the two metal features proximate to the extension 465b. The $1^{st}$ and $2^{nd}$ extensions 465a, 465b provide a two-dimensional characteristic to the $1^{st}$ power rail 460.

Similarly, in one embodiment, the $2^{nd}$ power rail 450 may comprise a $3^{rd}$, a $4^{th}$, a $5^{th}$, and a $6^{th}$ extension (respectively 455a, 455b, 455c, and 455d) protruding out of the main body of the power rail 450. The $3^{rd}$ and $4^{th}$ extensions 455a, 455b may be placed above the main body of the $2^{nd}$ power rail 450. Thus circuit features, such as vias, middle-of-line (MOL) feature, etc., may be positioned. The $5^{th}$ and $6^{th}$ extensions 455c, 455d may be placed below the main body of the $2^{nd}$ power rail 450. In this manner, design rules relating to features above and below the $2^{nd}$ power rail 450 are satisfied as a result of the extensions.

The $3^{rd}$, $4^{th}$, $5^{th}$, and $6^{th}$ extensions (455a, 455b, 455c, and 455d) provide a two-dimensional characteristic to the $2^{nd}$ power rail 460. Further, these extensions (455a, 455b, 455c, and 455d) are formed to be centered about a track 440. The $1^{st}$ and $2^{nd}$ power rails may be implemented into a functional/standard cell, within a cell boundary 490, as described below.

Figure 5:
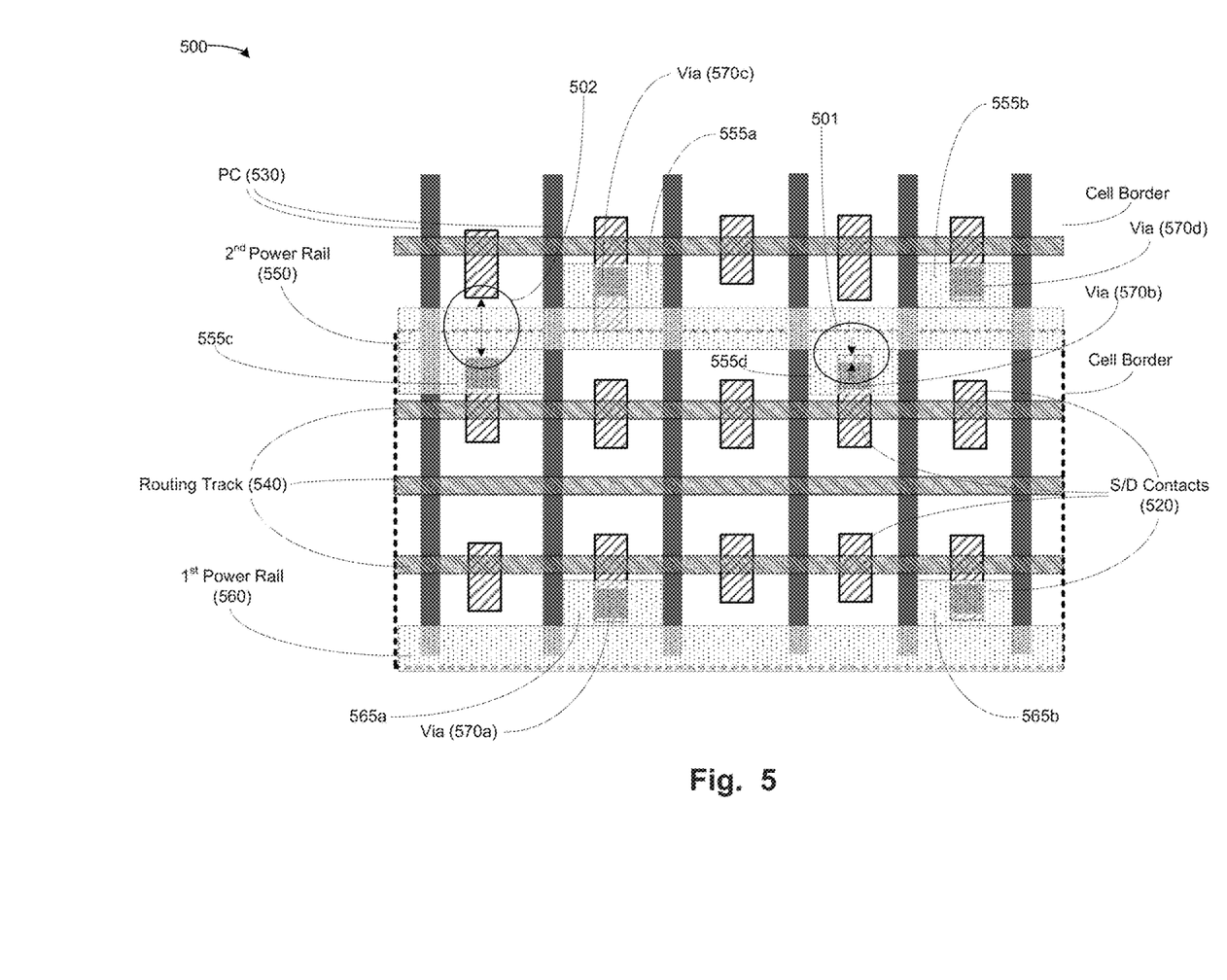
FIG. 5 illustrates a stylized depiction of a functional/standard cell, in accordance with embodiments herein.

Turning now to FIG. 5, a stylized depiction of a functional/standard cell, in accordance with embodiments herein, is illustrated. A cell 500 comprises a plurality of routing tracks 540 (e.g., M2 routing tracks) on which metal features may be formed. The cell 500 may comprise a standard number of routing tracks 540 semiconductor device. The cell 500 comprises two metal power rails that are less wide than the standard width of power rails. The cell 500 includes a 1st power rail 550, which may be a VDD power rail, and a 2nd power rail 560, which may be a VSS power rail. Therefore, as compared to some standard cells, the cell 500 of FIG. 5 may be made smaller by using smaller track pitch and narrower power rails.

Further, the functional cell 500 includes a plurality of source/drain (S/D) contacts 520, e.g., CB, CA, and transsilicide (TS) features. The cell 500 also comprises a plurality of PC (gate) features 530. Further, a plurality of vias 570a, 570b may be used to connect and/or route one or more PC features 530, S/D features 520, and/or power rails 550, 560.

In one embodiment, the $1^{st}$ power rail 560 comprises a $1^{st}$ extension 565a and a $2^{nd}$ extension 565b. The $1^{st}$ and $2^{nd}$ extensions 565a, 565b are placed such that design rules e.g., (via enclosure rules and tip-to-tip rules) are satisfied. For example, the $1^{st}$ extension 565a may be positioned to accommodate the via 570a and conform to the via enclosure rules. The 2nd extension 565b may be positioned to accommodate the tip-to-tip requirements of two MOL S/D connection feature 520 proximate to the extension 565b.

The $1^{st}$ and $2^{nd}$ extensions 565a, 565b provide to a two-dimensional characteristic to the $1^{st}$ power rail 560. Further, the $1^{st}$ and $2^{nd}$ extensions 565a, 565b are formed to be centered about a routing track 540.

Similarly, in this embodiment, the $2^{nd}$ power rail 550 may comprise a $3^{rd}$, $4^{th}$, $5^{th}$, and $6^{th}$ extensions (respectively 555a, 555b, 555c, and 555d) protruding out of the main body of the $2^{nd}$ power rail 550. The $3^{rd}$ and $4^{th}$ extensions 555a, 555b may be placed above the main body of the $2^{nd}$ power rail 550. Thus circuit features, such as vias, middle-of-line (MOL) feature, etc., may be positioned within the extensions for adherence to design rules. For example, a via 570c may be formed in the area of the $3^{rd}$ extension 555c such that via enclosure rules are satisfied. Further, a via 570d may be positioned in the area of the $4^{th}$ extension 555b such that via enclosure rules are satisfied.

The $5^{th}$ and $6^{th}$ extensions 555c, 555d may be placed below the main body of the $2^{nd}$ power rail 550. An MOL feature, e.g., an S/D connection feature 520 may be positioned partially in the $5^{th}$ extension 555c such that tip to tip rules are followed by with respect to another S/D connection feature 520 above the $2^{nd}$ power rail 550. Further, a via 570b may be positioned in the area of the $6^{th}$ extension 555d such that via enclosure rules are satisfied.

The $3^{rd}$, $4^{th}$, $5^{th}$, and $6^{th}$ extensions (555a, 555b, 555c, and 555d) provide a two-dimensional characteristic to the $2^{nd}$ power rail 560. Further, the extensions 555a, 555b, 555c, and 555d are formed to be centered about a routing track 540. As such, design rules relating to features above and below the $2^{nd}$ power rail 550 are satisfied as a result of the extensions (see e.g., circle 501 (via enclosure DRC rule satisfaction) and circle 502 (tip to tip DRC rule satisfaction)). Using the power rail extensions exemplified in FIG. 5, a smaller functional cell may be formed, while maintaining adherence to design rules, such as via enclosure rules, tip-to-tip rules, etc.

Figure 6:
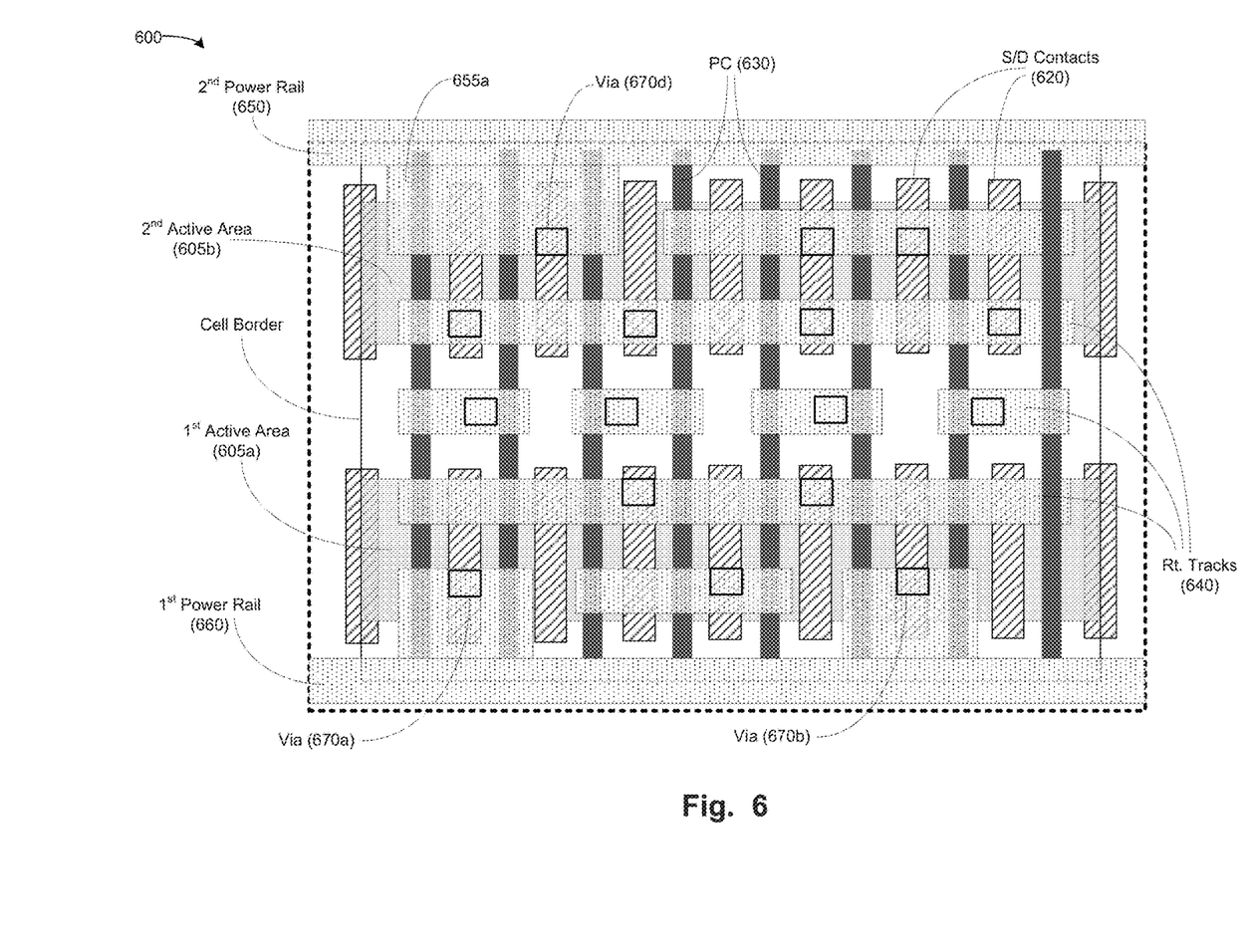
FIG. 6 illustrates a stylized depiction of a specific, exemplary layout design of a standard functional cell design, in accordance with embodiments herein.

Turning now to FIG. 6, a stylized depiction of a layout of a specific, exemplary standard functional cell design, in accordance with embodiments herein, is illustrated. A cell 600 (e.g., an AOI22 cell) comprises a plurality of routing tracks 640 (e.g., M2 routing tracks) on which metal routing features may be formed. The cell 600 may comprise a standard number of routing tracks 640, e.g., 8.75T in a 10 nm-technology semiconductor device. The cell comprises a $1^{st}$ active area 605a and a $2^{nd}$ active area 605b.

The cell 600 comprises two metal power rails that are less wide than the standard width of power rails. The cell 600 includes a 1st power rail 650, which may be a VDD power rail, and a 2nd power rail 660, which may be a VSS power rail. Therefore, as compared to prior art standard cells, the cell 600 of FIG. 6 may be made smaller by using small track pitch and narrower power rails.

Further, the functional cell 600 includes a plurality of source/drain (S/D) contacts 620, e.g., CB, CA, and trans-silicide (TS) features. The cell 600 also comprises a plurality of PC (gate) features 630. Further, a plurality of vias 670a, 670b, 670c may be used to connect and/or route one or more PC features 630, S/D features 620, and/or power rails 650, 660.

In one embodiment, the $1^{st}$ power rail 660 comprises a $1^{st}$ extension 665a and a $2^{nd}$ extension 665b. The $1^{st}$ and $2^{nd}$ extensions 665a, 665b are placed such that design rules e.g., (via enclosure rules and tip-to-tip rules) are satisfied. For example, the $1^{st}$ extension 665a may be positioned to accommodate the via 670a and conform to the via enclosure rules. The $2^{nd}$ extension 665b may be positioned to accommodate the via 670b and also conform to the via enclosure rules The $1^{st}$ and $2^{nd}$ extensions 665a, 665b provide a two-dimensional characteristic to the $1^{st}$ power rail 660.

The $2^{nd}$ power rail 650 may comprise a $3^{rd}$ extension 655c protruding out of the main body of the $2^{nd}$ power rail 650.

The via 670c may be formed in the area of the $3^{rd}$ extension 655c such that via enclosure rules are satisfied. The $3^{rd}$ extension 655c provides to a two-dimensional characteristic to the $2^{nd}$ power rail 660. Further, the $3^{rd}$ extensions 655c is formed to be centered about one of the routing tracks 640. In this manner, design rules relating to features above and below the $2^{nd}$ power rail 650 are satisfied as a result of the extensions. The power rail extensions in the cell 600 allow for reducing the size of the cell 600, while maintaining the number of original tracks, maintaining the drive strength of the cell 600, and adhering to design rules.

Figure 7:
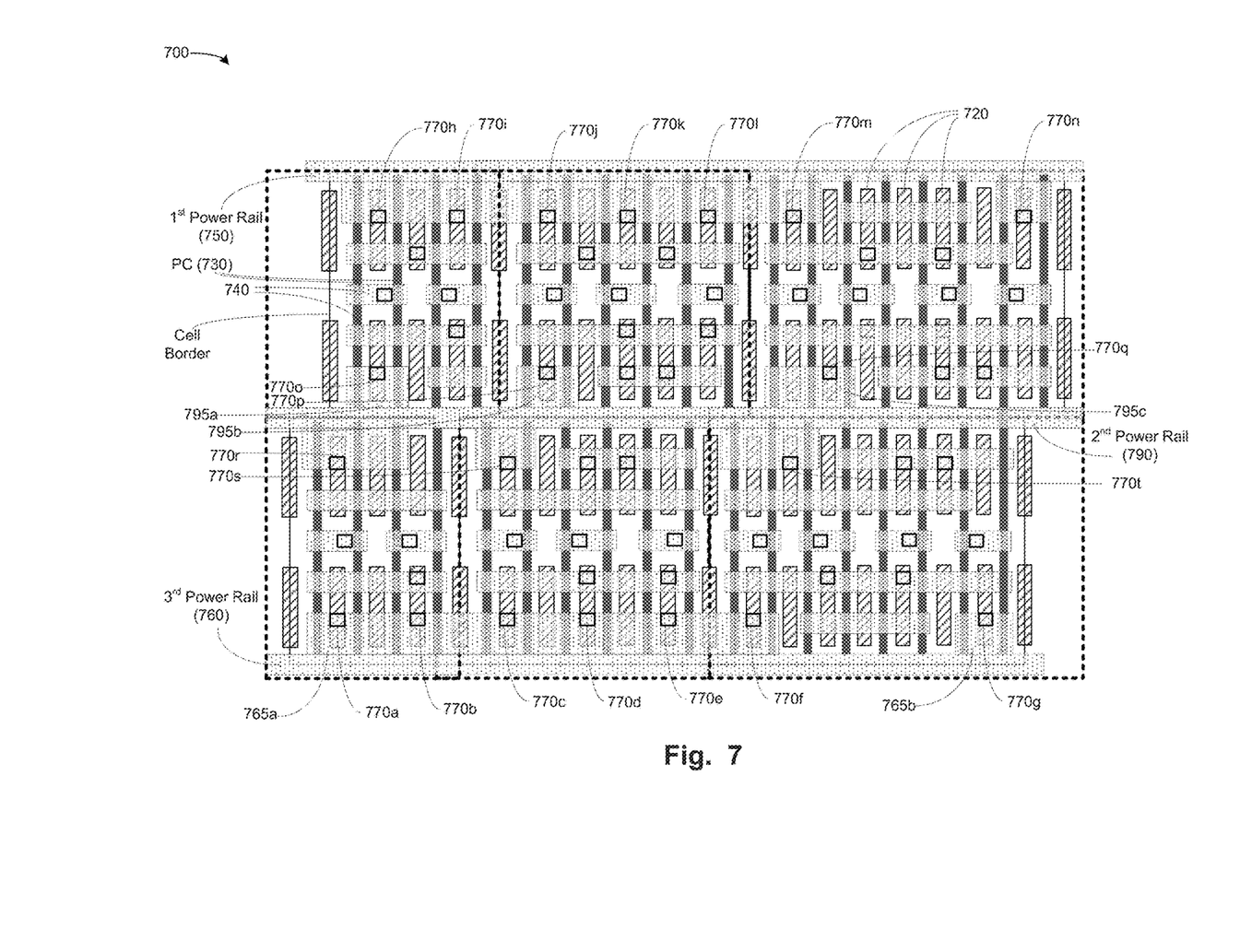
FIG. 7 illustrates a stylized depiction of the placement of a plurality of standard function cells, in accordance with embodiments herein.

Turning now to FIG. 7, a stylized depiction of the placement of a plurality of standard function cells, in accordance with embodiments herein, is illustrated. A cell design 700 comprises a plurality of individual cells that are placed to form the cell design 700. Each one of the functional cells comprises a plurality of routing tracks 740 (e.g., M2 routing tracks) on which metal routing features may be formed. Each one of the functional cells may comprise a standard number of routing tracks 740 semiconductor device. Each one of the functional cells comprises two metal power rails that are less wide than the standard width of power rails.

Each of the upper set of cells comprises a 1st power rail 750, which may be a VDD power rail, and a 2nd power rail 790, which may be a VSS power rail. As shown in the middle portion of FIG. 7, the $2^{nd}$ power rail 790 may be shared by the upper and lower set of cells. Each of the lower set of cells comprises a $3^{rd}$ power rail 760, which may be a VDD power rail. As compared to prior art cell designs, the cell design 700 of FIG. 7 may be made smaller cells by using narrower track spacing and narrower power rails.

Further, each one of the functional cells comprises a plurality of source/drain (S/D) contacts 720, e.g., CB, CA, and trench silicide features. Each one of the functional cells also comprises a plurality of PC (gate) features 730. Further, a plurality of vias (770a through 770t) may be used to connect and/or route one or more metal features PC features 730, S/D features 720, and/or power rails 750, 760, 790.

In one embodiment, the $3^{rd}$ power rail 760 comprises a $1^{st}$ extension 765a and a $2^{nd}$ extension 765b. The $1^{st}$ extension 765a may be a combination of extensions of each of the lower set of cells.

The $1^{st}$ and $2^{nd}$ extensions 765a, 765b are placed such that design rules e.g., (via enclosure rules and tip-to-tip rules) are satisfied. For example, the $1^{st}$ extension 765a may be positioned to accommodate the vias 770a through 770f and conform to the via enclosure rules. The $2^{nd}$ extension 765b may be positioned to accommodate the via 770g and also conform to the via enclosure rules. The $1^{st}$ and $2^{nd}$ extensions 765a, 765b provide to a two-dimensional characteristic to the $1^{st}$ power rail 760.

The $1^{st}$ power rail 750 may comprise a $3^{rd}$ extension 765a and a $4^{th}$ extension 765b protruding out of the main body of the $2^{nd}$ power rail 750. The $3^{rd}$ extension 765a may be a combination of extensions of each of the upper set of cells.

The vias 770h through 770m may be formed in the area of the $3^{rd}$ extension 755c such that via enclosure rules are satisfied. The via 770n may be formed in the area of the $4^{th}$ extension 765b such that via enclosure rules are satisfied. The $3^{rd}$ and $4^{th}$ extensions 765a, 765b impart a two-dimensional characteristic to the $2^{nd}$ power rail 760. In this manner, design rules relating to features above and below the $2^{nd}$ power rail 750 are satisfied as a result of the extensions.

The shared, $2^{nd}$ power rail 790 may comprise a $5^{th}$, a $6^{th}$, and a $7^{th}$ (795a, 795b, 795c) extension that protrude upwards into the upper set of cells. The via 770o may be formed in the area of the 5$^{th}$ extension 795a such that via enclosure rules are satisfied. The via 770p may be formed in the area of the 6$^{th}$ extension 795b such that via enclosure rules are satisfied. The via 770q may be formed in the area of the 7$^{th}$ extension 795b such that via enclosure rules are satisfied.

The 2$^{nd}$ power rail 790 may also comprise an 8$^{th}$, a 9$^{th}$, and a 10$^{th}$ extension (respectively 765d, 795e, 795f) that protrude downwards into the lower set of cells. The via 770r may be formed in the area of the 8$^{th}$ extension 795d, the via 770s may be formed in the area of the 9$^{th}$ extension 795e, and the via 770t may be formed in the area of the 10$^{th}$ extension 795f such that via enclosure rules are satisfied. As shown in FIG. 7, the power rails and/or some of the extensions may be shared by the various cells of the set of cells 700. The power rail extensions in the upper and lower set of cells of the cell design 700 allow for reducing the size of the cell design 700, while maintaining the number of original tracks, maintaining the drive strength of the set of cells, and adhering to standard design rules.

Figure 8:
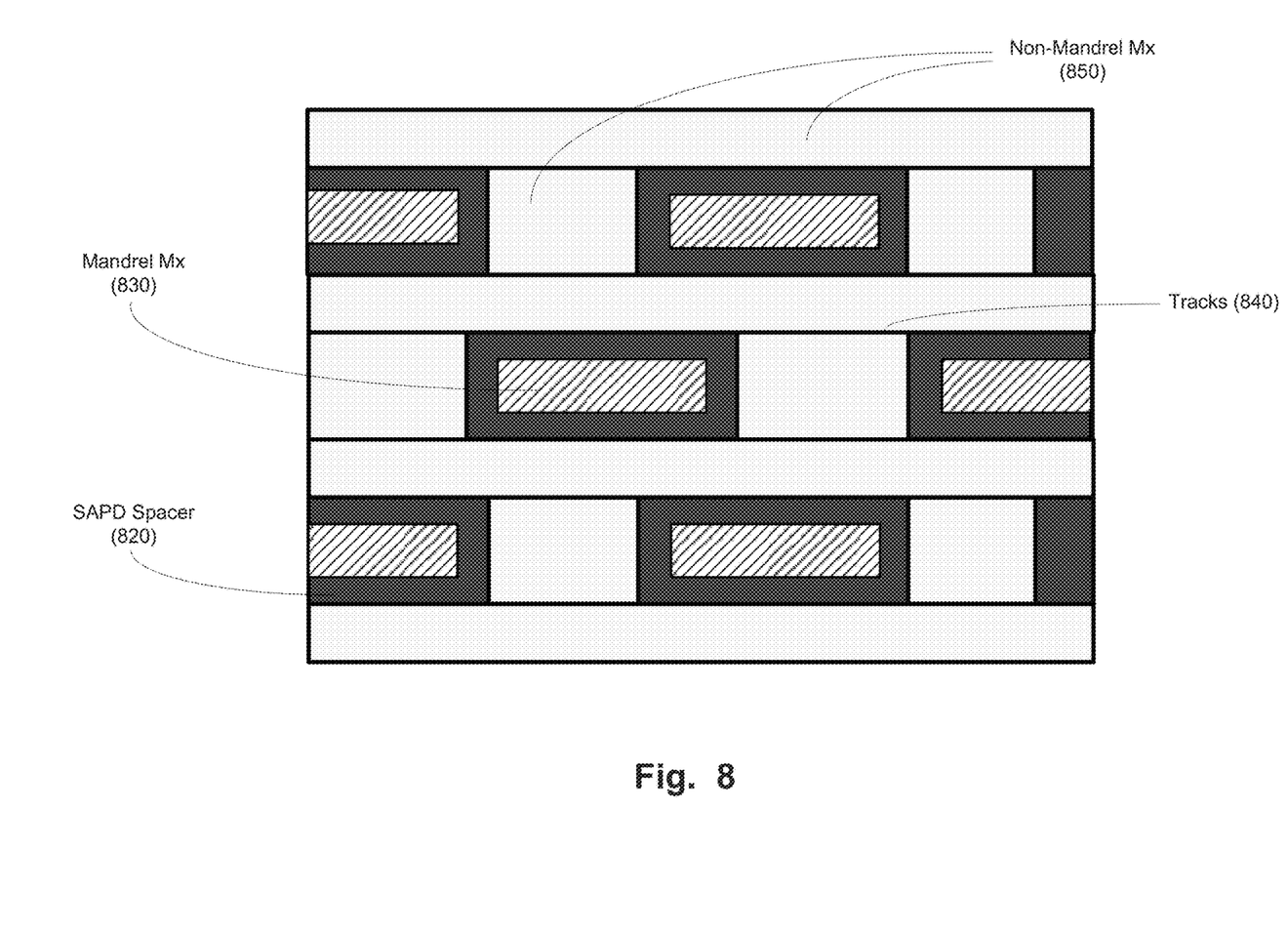
FIGS. 8-10 illustrate stylized depictions of a process for forming a functional cell, in accordance with embodiments herein.
Figure 9:
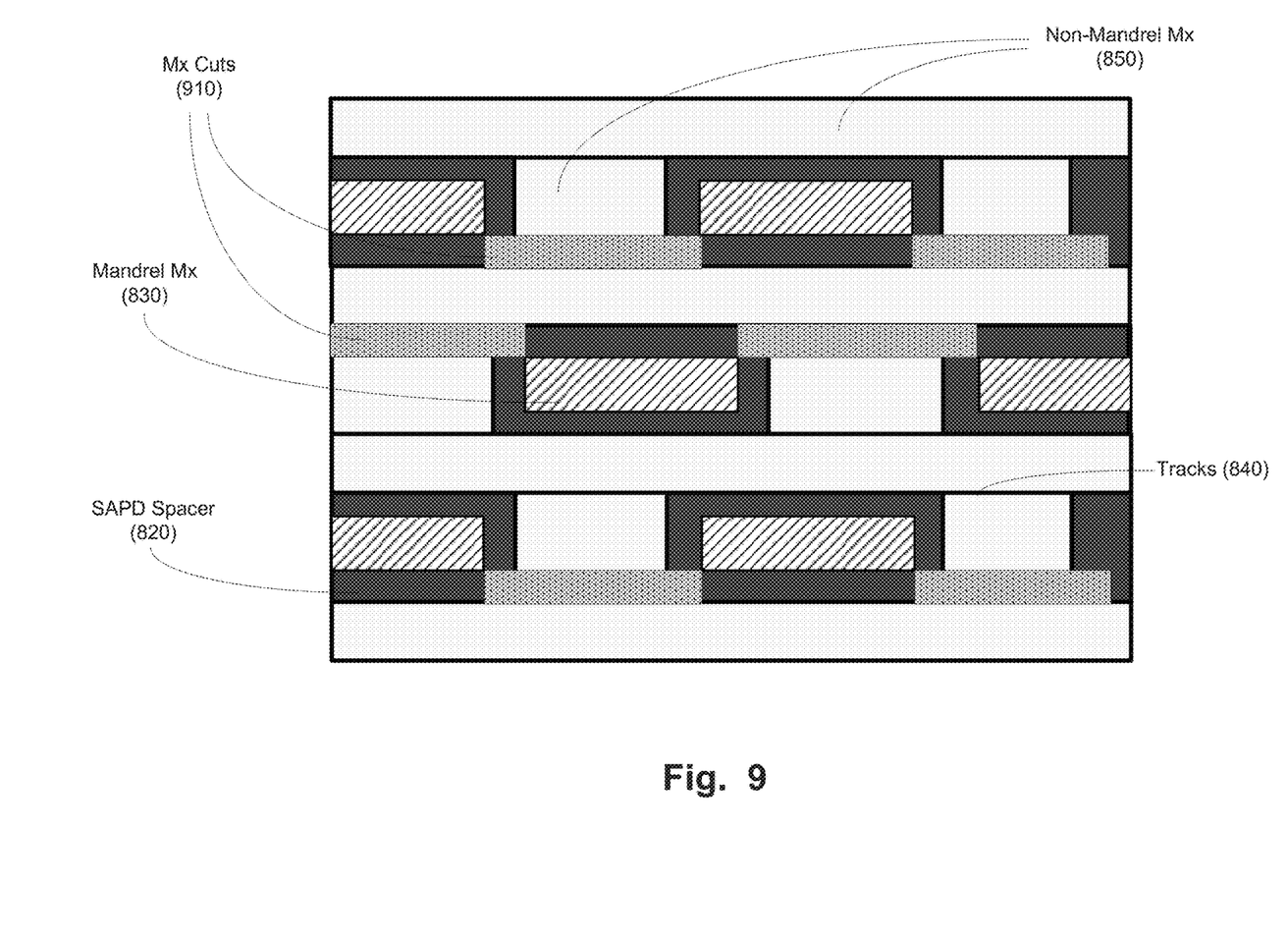
Figure 10:
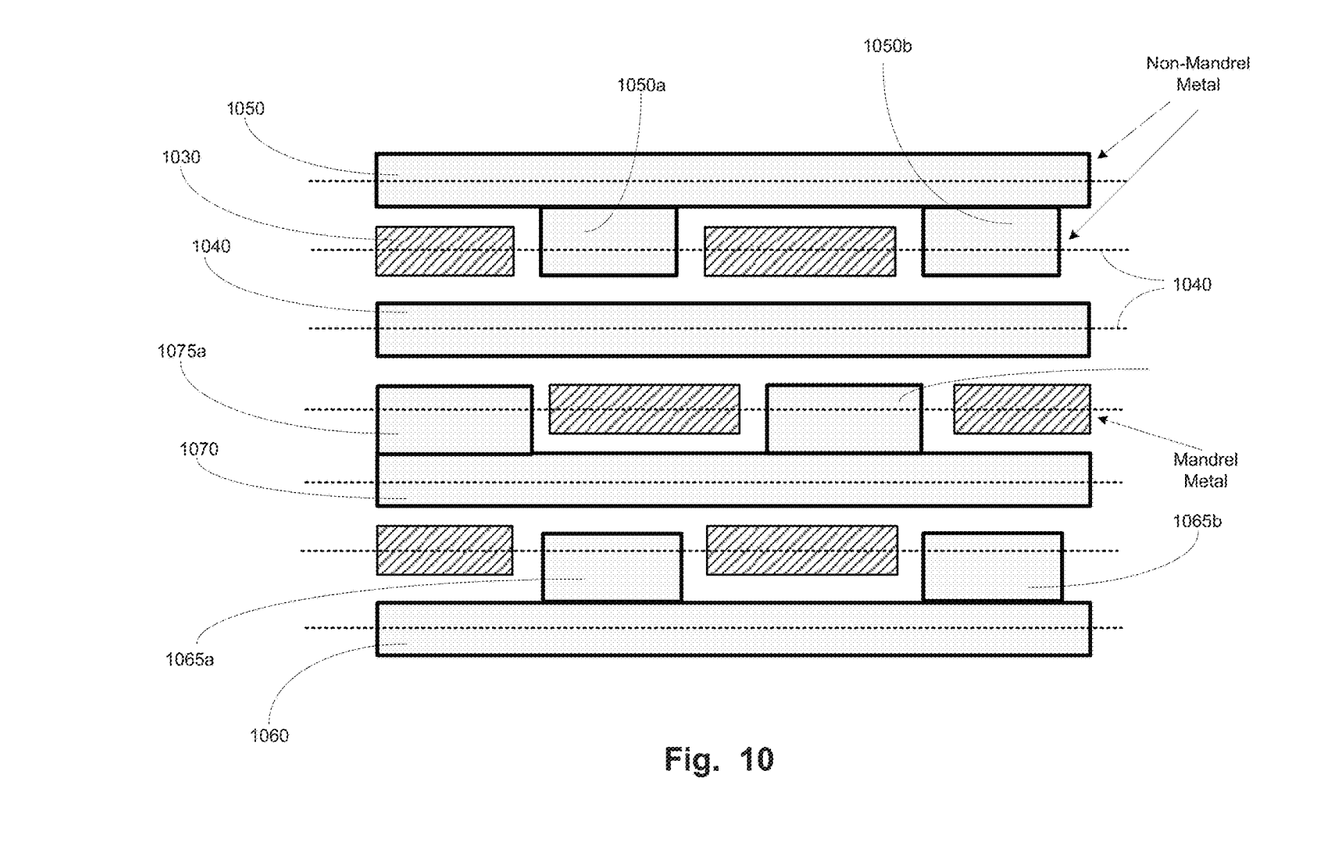

FIGS. 8-10 illustrate stylized depictions of a process for forming a functional cell, in accordance with embodiments herein. FIGS. 8-10 relate to performing a self-aligned double-pattering (SADP) process with a cut process for forming a cell 800 that comprises power rails that comprise extensions, similar to the extensions described above. As shown in FIG. 8, a plurality of tracks 840 may be formed on a substrate (e.g., silicon substrate). A plurality of mandrel metal (Mx) feature 830 may be formed. In one embodiment, the "Mx" metal features may refer to metal-0 (M0), metal-1 (M1), or metal-2 (M1) metal feature. A plurality of non-mandrel metal (Mx) features 850 may also be formed. At least some of the non-mandrel Mx feature 850 may be formed to provide power rail structures. Further, portions of the non-mandrel Mx features 850 are strategically placed to form extensions of power rails in predetermined locations of the cell.

Further, a plurality of SADP spacers 820 may be formed around the Mx mandrel features 830, as shown in FIG. 8. These spacers provide for defining the shapes of power rails, extensions of the power rails, and other metal features of the cell 800.

As shown in FIG. 9, a plurality of Mx cuts 910 may be placed onto the cell 800. The Mx cuts may refer to one of a plurality of cuts. Further, the Mx cut process may be a self-aligned process. Non-mandrel metal lines may be cut using a self-aligned process to form power rails with extensions.

Upon performing the cut processes and performing processes know to those skilled in the art having benefit of the present disclosure, a plurality of two-dimensional power rails with extensions may be revealed, as exemplified in FIG. 10. FIG. 10 shows the formation of a plurality of two-dimensional power rails, which in one embodiment, is formed from non-mandrel metal. A plurality of tracks 1040 may be used to place a plurality of mandrel Mx metal features and non-mandrel Mx metal features within the cell 800.

Using the processes described herein and further processes known to those skilled in the art having benefit of the present disclosure, a 1$^{st}$ power rail 1060, a 2$^{nd}$ power rail 1050, and a 3$^{rd}$ power rail 1070, may be formed. The 1$^{st}$ power rail 1060 may comprise a 1$^{st}$ extension 1065a and a 2$^{nd}$ extension 1065b. The 2$^{nd}$ power rail 1050 may comprise a 1$^{st}$ extension 1055a and a 2$^{nd}$ extension 1055b. The 3$^{rd}$ power rail 1070 may comprise a 1$^{st}$ extension 1075a and a 2$^{nd}$ extension 1075b. Interspersed between the power rails 1050, 1060, 1070 may be a plurality of mandrel Mx features 1030.

Further processing known to those skilled in the art having benefit of the present disclosure may be performed to form vertical metal features, MOL features (e.g., CA, CB, TS features), vias, etc., for form the functional cell 800. As such, the functional cell 800 may be formed to provide a predetermined function while comprising one or more power rails with extensions such that a smaller profile for the functional cell 800 is possible.

Figure 11:
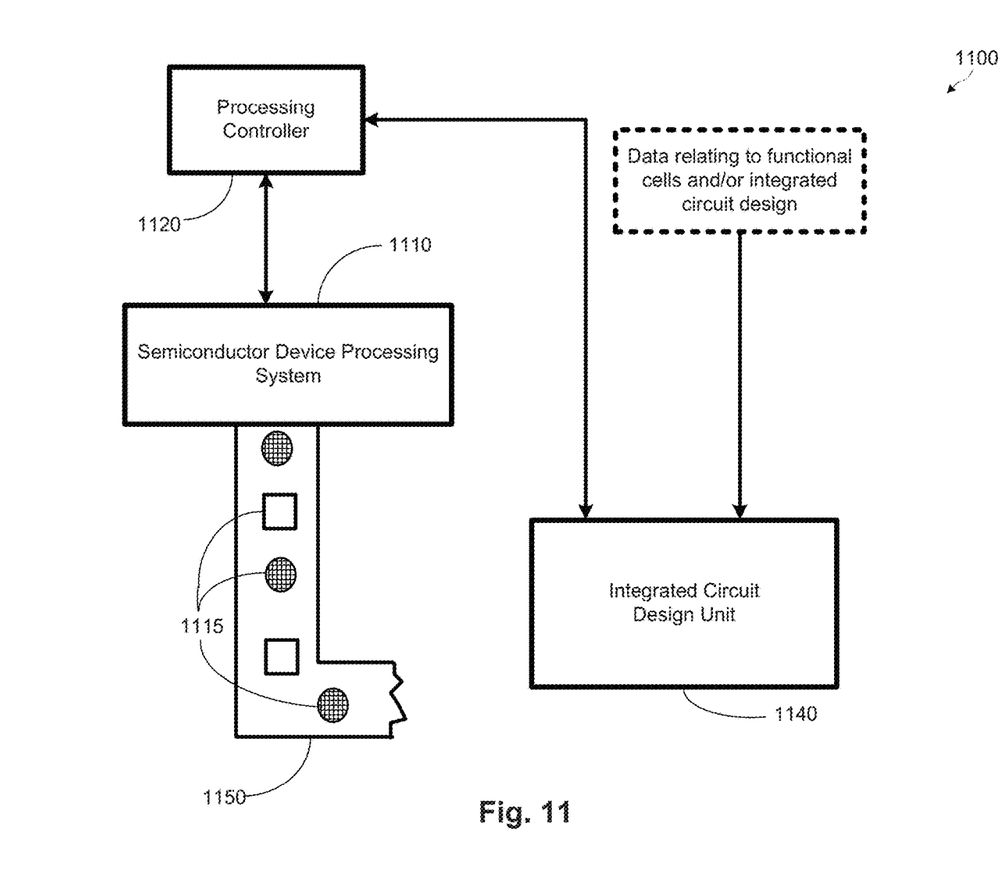
FIG. 11 illustrates semiconductor device processing system for manufacturing a functional cell, in accordance with some embodiments herein.

Turning now to FIG. 11, a stylized depiction of a system for fabricating a semiconductor device package comprising a topside interconnection substrate, in accordance with embodiments herein, is illustrated. The system 1100 of FIG. 11 may comprise a semiconductor device processing system 1110 and a design unit 1140. The semiconductor device processing system 1110 may manufacture integrated circuit devices based upon one or more designs provided by the design unit 1140.

The semiconductor device processing system 1110 may comprise various processing stations, such as etch process stations, photolithography process stations, CMP process stations, etc. One or more of the processing steps performed by the processing system 1110 may be controlled by the processing controller 1120. The processing controller 1120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1110 may produce integrated circuits on a medium, such as silicon wafers. The production of integrated circuits by the device processing system 1110 may be based upon the circuit designs provided by the integrated circuits design unit 1140. The processing system 1110 may provide processed integrated circuits/devices 1115 on a transport mechanism 1150, such as a conveyor system. In some embodiments, the conveyor system may be sophisticated clean room transport systems that are capable of transporting semiconductor wafers. In one embodiment, the semiconductor device processing system 1110 may comprise a plurality of processing steps, e.g., the 1$^{st}$ process step, the 2$^{nd}$ process set, etc., as described above.

In some embodiments, the items labeled "1115" may represent individual wafers, and in other embodiments, the items 1115 may represent a group of semiconductor wafers, e.g., a "lot" of semiconductor wafers. The integrated circuit or device 1115 may be a transistor, a capacitor, a resistor, a memory cell, a processor, and/or the like. In one embodiment, the device 1115 is a transistor and the dielectric layer is a gate insulation layer for the transistor.

The integrated circuit design unit 1140 of the system 1100 is capable of providing a circuit design that may be manufactured by the semiconductor processing system 1110. The design unit 1140 may receive data relating to the functional cells to utilize, as well as the design specifications for the integrated circuits to be designed. In one embodiment, the integrated circuit design unit 1140 provide information as to placement of power rails and extensions such functional cell of dimensions may be formed, which conforming with design rules (e.g., via enclosure rules, tip-to-tip design rules, etc.). Therefore, the system 1100 is capable of producing functional cells that comprise power rails comprising extensions, such that the functional cells may be made of smaller dimensions while complying with design rules for standard cells. In this manner, using embodiments herein, cells of smaller dimensions may be fabricated, while maintaining sufficient drive current and conforming to design rules.

In other embodiments, the integrated circuit design unit 1140 may perform an automated determination of the shifts, automatically select a substitute or child, and automatically incorporate the substitute cell into a design. For example, once a designer or a user of the integrated circuit design unit 1140 generates a design using a graphical user interface to communicate with the integrated circuit design unit 1140, the unit 1140 may perform automated modification of the design for forming smaller functional cells.

The system 1100 may be capable of performing analysis and manufacturing of various products involving various technologies. For example, the system 400 may design and production data for manufacturing devices of CMOS technology, Flash technology, BiCMOS technology, power devices, memory devices (e.g., DRAM devices), NAND memory devices, and/or various other semiconductor technologies.

Although in some examples, circuits herein were described in terms of NMOS devices for consistency, those skilled in the art would appreciate that concepts described herein may also apply to PMOS devices and remain within the scope of embodiments herein.

The methods described above may be governed by instructions that are stored in a non-transitory computer readable storage medium and that are executed by, e.g., a processor in a computing device. Each of the operations described herein (e.g., FIGS. 8-10 and 11) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The drawings herein are illustrative only and are not drawn to scale. The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
   determining a first location for an extension of a first power rail in a functional cell;
   forming a first extension of said first power rail in a first direction; and
   forming a second extension of said first power rail in a second direction in said first location.

2. The method of claim 1, further comprising forming at least one additional extension of said first power rail in said second direction.

3. The method of claim 1, wherein:
   forming said first extension of said first power rail comprises the forming a first extension in a vertical configuration; and
   the forming a second extension of said first power rail comprises forming said second extension in a horizontal configuration.

4. The method of claim 1, further comprising:
   determining a second location for an extension of said first power rail; and
   forming a third extension of said first power rail in said second direction in said second location.

5. The method of claim 1, wherein the forming a first extension in said first power rail in a first direction and the forming a second extension in said first power rail in a second direction comprise:
   printing a plurality of mandrel metal forms on a substrate;
   adding a plurality of self-aligned double-pattering (SADP) spacers within said mandrel metal forms; and
   performing a non-mandrel self-aligned cut processing for forming a plurality of non-mandrel shape in said first direction and said second direction.

6. The method of claim 1, further comprising:
   determining a first location for an extension of a second power rail in said functional cell; and
   forming a first extension of said second power rail in a first direction; and
   forming a second extension of said second power rail in a second direction in said first location.

7. The method of claim 6, further comprising:
   determining a second location for an extension of said second power rail; and
   forming a third extension of said second power rail in said second direction in said second location;
   determining a third location for an extension of said second power rail; and
   forming a fourth extension of said first power rail in said third direction in said third location, wherein said third direction is opposite of said second direction.

8. The method of claim 7, further comprising electrically coupling said first power rail to a power VDD signal and electrically coupling said second power rail to a ground VSS signal.

9. A device, comprising:
   a functional cell for forming an integrated circuit, said functional cell comprising:
      a first power rail comprising:
         a first extension configured in a first dimension; and
         a second extension configured in a second dimension, said second extension formed in a predetermined first location.

10. The device of claim 9, wherein said device comprises a plurality of functional cells arranged in an integrated circuit design.

11. The device of claim 9, wherein said second extension is an extension of said first extension.

12. The device of claim 9, wherein:
    said first extension of said first power rail is in a vertical configuration; and
    said second extension of said first power rail is in a horizontal configuration.

13. The device of claim 9, further comprising:
a second power rail comprising:
a first extension configured in said first dimension; and
a second extension configured in said second dimension, said second extension formed in a predetermined second location.

14. The device of claim 13, wherein at least one of said second extension of said first power rail, or said second extension of said second power rail comprises a via conforming with at least one cell design rule.

15. The device of claim 13, wherein said first power rail is operatively coupled to a ground VSS signal and said second power VDD rail is operatively coupled to a power signal.

16. The device of claim 13, wherein said first dimension of said first power rail and said second power rail is in a horizontal direction and said second dimension is in a vertical direction perpendicular to said first dimension.

17. A system, comprising:
a design unit adapted to:
determine a first location for an extension of a first power rail in a functional cell;
form a first extension of said first power rail in a first direction; and
form a second extension of said first power rail in a second direction in said first location to generate a circuit layout;
a semiconductor device processing system for fabricating an integrated circuit device based upon said circuit layout;
and
a processing controller operatively coupled to said semiconductor device processing system, said processing controller configured to control an operation of said semiconductor device processing system.

18. The system of claim 17, wherein:
said first extension of said first power rail is in a vertical configuration; and
said second extension of said first power rail is in a horizontal configuration.

19. The system of claim 17, wherein said design unit is further configured to
determine a second location for an extension of said first power rail; and
form a third extension of said first power rail in said second direction in said second location.

20. The system of claim 17, wherein said design unit is further configured to
determine a first location for an extension of a second power rail in said functional cell;
form a first extension of said second power rail in a first direction; and
form a second extension of said second power rail in a second direction in said first location.

* * * * *